US008907410B2

(12) United States Patent
Kothandaraman et al.

(10) Patent No.: US 8,907,410 B2
(45) Date of Patent: Dec. 9, 2014

(54) TSV STRUCTURE WITH A BUILT-IN U-SHAPED FET TRANSISTOR FOR IMPROVED CHARACTERIZATION

(71) Applicant: International Business Machines Corporation, Armonk, NY (US)

(72) Inventors: Chandrasekharan Kothandaraman, Hopewell Junction, NY (US); Sami Rosenblatt, White Plains, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 13/870,038

(22) Filed: Apr. 25, 2013

(65) Prior Publication Data

US 2014/0319600 A1 Oct. 30, 2014

(51) Int. Cl.
*H01L 29/78* (2006.01)
*H01L 21/336* (2006.01)
*H01L 29/66* (2006.01)
*H01L 21/8234* (2006.01)
*H01L 29/423* (2006.01)

(52) U.S. Cl.
CPC .... *H01L 29/66666* (2013.01); *H01L 29/66787* (2013.01); *H01L 29/7827* (2013.01); *H01L 21/823437* (2013.01); *H01L 29/4236* (2013.01); *H01L 29/66621* (2013.01)

USPC ........... 257/330; 257/296; 257/328; 257/329; 257/335; 257/E21.19; 257/E21.21; 257/E21.545; 257/E21.646; 438/239; 438/270; 438/430; 438/589

(58) Field of Classification Search
CPC . H01L 21/78; H01L 21/823437; H01L 29/78; H01L 29/4236; H01L 29/66621; H01L 29/66666; H01L 29/66787; H01L 29/7827
USPC ............ 257/296, 328, 329, 330, 335, E21.19, 257/E21.41, E21.545, E21.646; 438/239, 438/270, 430, 589
See application file for complete search history.

(56) References Cited

U.S. PATENT DOCUMENTS

| | | | | |
|---|---|---|---|---|
| 3,619,737 | A * | 11/1971 | Chiu | 257/265 |
| 8,187,940 | B2 * | 5/2012 | Lee et al. | 438/270 |
| 2009/0097321 | A1 * | 4/2009 | Kim et al. | 365/185.18 |
| 2009/0224312 | A1 * | 9/2009 | Taketani | 257/330 |
| 2010/0240180 | A1 * | 9/2010 | Jeon et al. | 438/239 |
| 2011/0121387 | A1 * | 5/2011 | Hebert et al. | 257/334 |

* cited by examiner

*Primary Examiner* — Dao H Nguyen
(74) *Attorney, Agent, or Firm* — H. Daniel Schnurmann (57) ABSTRACT

A through-the silicon via (TSV) structure providing a built-in TSV U-shaped FET that includes an annular gate shaped as a TSV partially embedded in a substrate, the annular gate having an inner and an outer surface bound by an oxide layer; a drain formed on an isolated epitaxial layer on top of the substrate conformally connecting the gate oxide layer surrounding the inner annular surface of the TSV; a source partially contacting said gate oxide layer conformally contacting gate oxide layer surrounding the outer surface of the TSV.

20 Claims, 13 Drawing Sheets

TSV STRUCTURE WITH A BUILT-IN U-SHAPED FET TRANSISTOR FOR IMPROVED CHARACTERIZATION

FIELD OF THE INVENTION

The present disclosure relates generally to the field of semiconductor devices, and more particularly to an FET provided with a through-substrate via (TSV) structure and method of manufacturing the same.

BACKGROUND

With the advance of the semiconductor manufacturing technology, more and more devices are integrated into a semiconductor circuit. Through-Silicon-Vias (TSV) extend all the way through the substrate so that electrical connections can be made from one major planar side of the substrate, perpendicularly through the substrate, and to an opposite major planar side of the substrate. Conventional TSVs are generally copper vias extending through the substrate of a semiconductor chip. The copper via structure is laterally electrically isolated from the substrate by a silicon oxide dielectric liner, and etched into a bulk substrate to a predetermined depth (e.g., 40 μm). The remainder bulk semiconductor below the bottom of the TSV can be utilized as a seed for epitaxial semiconductor or ultimately to be polished away.

TSVs are known to be suitable for high speed signal transmission in structures such as e.g., in an interposer or in a silicon circuit board.

A TSV structure generally includes a metal strip portion that extends through a relatively long and relatively small diameter hole. A method of forming the TSV structure starts with a substrate layer having a hole. A cylindrical metal sheath lines up within the cylindrical sidewall surface of the hole. The substrate layer preferably includes a layer of monocrystalline semiconductor material having a first major surface disposed in a first plane, and a second major surface disposed in a second plane, where the first and second planes are parallel to one another and are generally separated by more than 75 microns. The hole typically has a small diameter hole, usually less than 100 microns.

Figure 1A:
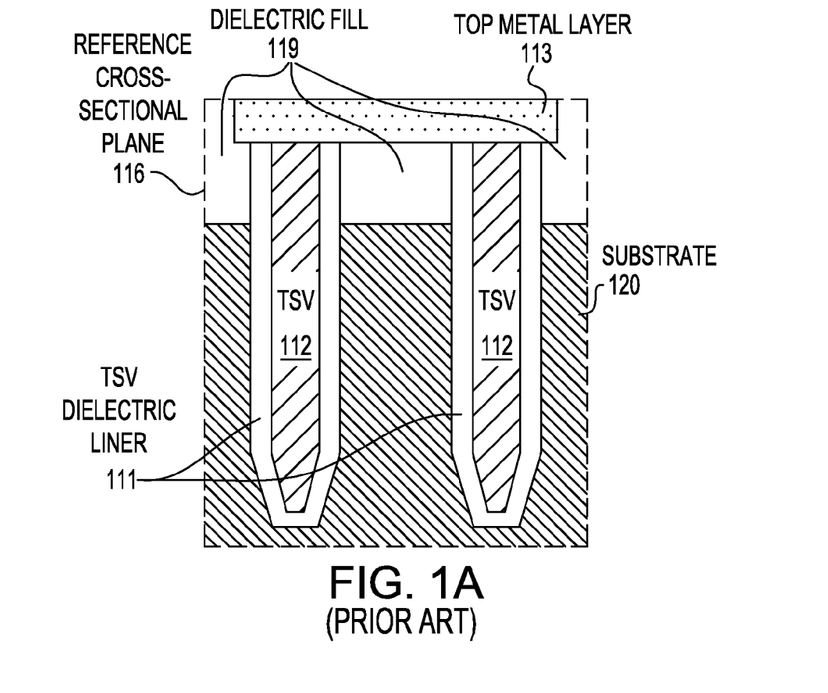
FIG. 1A shows a vertical cross-sectional view of an exemplary conventional TSV structure embedded in a substrate.

Referring to FIG. 1A, a conventional TSV is shown having a metal pad contact 113 covering the entire top surface of the TSV, typically utilized in a C-V measurement with terminals determined by the contacted TSV top surface, illustrated by a cross-sectional plane 116 and surrounded by silicon substrate 120. The resulting measurement is sensitive to leakage and oxide variation in a large area consisting of an annular shaped TSV 112 surrounded by the TSV dielectric liner 111 and substrate 120.

Figure 1B:
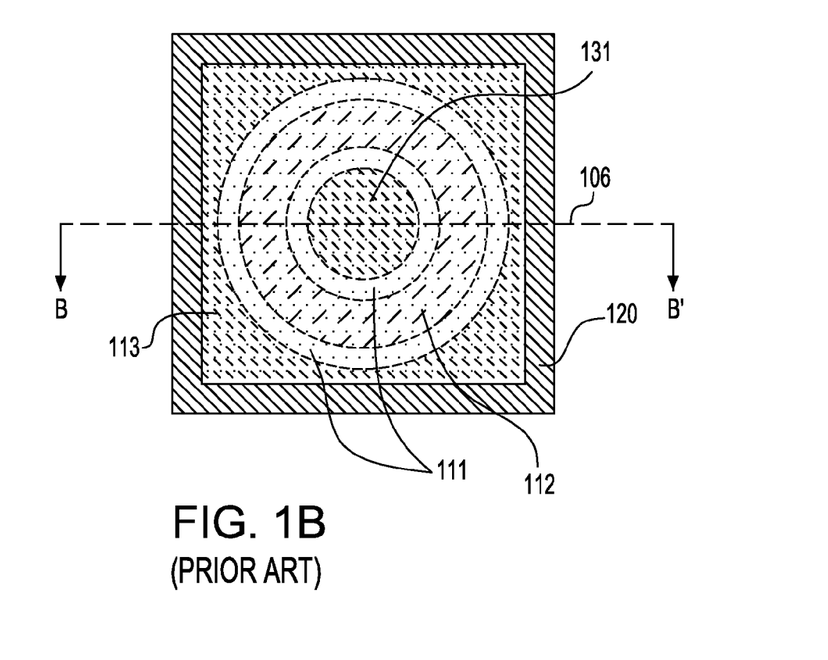
FIG. 1B is a top view of the exemplary prior art TSV shown in FIG. 1A showing a substrate along a cross-sectional line B-B' and illustrating the TSV dielectric liner fill and top metal layer.

Referring to FIG. 1B, a top-down cross-sectional plane 106 is shown framing the conventional TSV 112 embedded within substrate 120. The substrate can be made of Si, GE, SiAs, silicon-germanium alloy, and the like. The substrate is depicted having a top metal layer 113 embedded in dielectric fill 119. The TSV is further shown surrounded by dielectric liner 111. The region of the TSV surrounded by dielectric liner 111 is referred to as the core of the TSV, the core 131 filled with dielectric resting on the substrate.

Still referring to FIGS. 1A and 1B, the TSV structure is illustrated having an inner and an outer region of the substrate, the regions separated by TSV 112 annulus. The semiconducting material of substrate 120 within the TSV annulus is isolated from the semiconducting material substrate within the exterior of the TSV. The two regions communicate electrically only by way of the semiconducting material substrate 120 surrounding the bottom surface of the TSV annulus along the entirety of the annulus bottom surface. Therefore, the deeper the TSV, the longer is the bottom surface of the TSV 112, as shown in the cross-sectional view of FIG. 1A. Electrical current flowing through the semiconducting material substrate 120 connecting the inner and outer regions will therefore decrease as the bottom surface of the TSV becomes longer, or conversely the TSV becomes deeper while keeping all the remaining electrical parameters constant for comparison. Additionally, the electrical current varies when the TSV 112 metal electrical potential changes.

Conventional TSVs are generally unable to characterize the integrity of the TSV dielectric liner 111, particularly when the TSV dielectric liner is physically cracked, causing an increase in the flow of electrical current between the TSV 112 metal and the surrounding semiconducting material of substrate 120, which should normally be electrically isolated from each other for optimal use.

The previously described problem is further amplified by having the electrical channel surrounding the entire bottom surface of the TSV via the annulus. Any crack anywhere on the bottom surface can create sufficient electrical current leakage between the TSV 112 metal and either one of the inner or outer TSV regions.

A further problem can be created by the inability to interrogate the integrity of the TSV dielectric liner 111 by detecting copper metal that diffuses out of the TSV via annulus. The copper metal generally degrades the semiconducting properties of the channels.

In summary, the electrical measurements of capacitance generally do not cover the entire depth of the TSV and are therefore of limited use when charactering the overall integrity of the TSV liner. The liner can have a varying thickness along its depth, and can crack at different spots of its surface, or cannot block diffusion of copper from the TSV metal to the semiconducting material surrounding the TSV. Moreover, copper contamination of the semiconducting material surrounding the TSV can degrade the performance of devices in circuits outside the TSV.

Accordingly, it would be desirable to create a structure and a method of manufacturing the same making contact to the TSV core using an epitaxial layer and an annular TSV forming an FET, particularly when the FET is U-shaped. The desired structure should further be capable to provide a characterization to overcomes the limitations with other characterization structures and complement them, and further to make it possible to determine the integrity of the TSV dielectric liner.

SUMMARY

In one aspect of the invention, an embodiment provides a through-substrate via (TSV) structure making contact with the TSV core using an epitaxial layer and an annular TSV to form a U-shaped FET (TSV U-FET). The structure thus built enables current to flow around the bottom of the TSV through the surrounding silicon.

In another aspect, in one embodiment, the TSV U-FET is provided with three terminals. By way of elimination of the metal pad covering the TSV, a terminal can be built utilizing a metal stack running through the core of the TSV, contacting the n++ epitaxial layer that is found isolated after the TSV annulus is created. The metal stack is preferably contacted without a direct connection to the TSV, and utilizes a metal level that serves as a jumper wire.

In still another aspect, in one embodiment, the depth of the U-shaped TSV can be controlled by a tuning process characterized by cutting the hardware to produce cross-sectional views that can be imaged by advanced imaging techniques. Such cross-sectional views do not reveal the entire circumference of the TSV and can be of limited use when characterizing the overall depth of the TSV.

In yet another aspect, in one embodiment, the integrity of the TSV liner can be characterized through a combination of advanced imaging and electrical measurements of capacitance between the TSV metal and a metal wire outside the TSV or surrounding it on the outside. The metal wire on the outside can be placed in proximity of the TSV.

In a further aspect, in one embodiment, a semiconductor structure includes: a built-in U-shaped FET transistor having a TSV providing an annular gate, said TSV partially buried in a substrate, said annular gate being bound by an oxide layer, said annular gate having an inner and outer surface; a drain formed on an isolated epitaxial layer on a top surface of said substrate conformally connected to said gate oxide layer surrounding said inner surface of said TSV; and a source partially contacting said gate oxide layer conformally connected to said gate oxide layer surrounding said outer surface of said TSV.

In still another aspect, in one embodiment, a method of forming a semiconductor structure including: forming a U-shaped FET transistor using a TSV partially buried in a substrate providing an annular gate to the U-shaped FET, the annular gate being bound by an oxide layer with the annular gate having an inner and outer surface; forming a drain from an isolated epitaxial layer on a top surface of the substrate conformally connected to the gate oxide layer surrounding the inner surface of the TSV; and forming a source partially contacting the gate oxide layer conformally connected to the gate oxide layer surrounding the outer surface of the TSV.

BRIEF DESCRIPTION OF THE DRAWINGS

The present invention will be understood and appreciated more fully from the following detailed description of the invention, taken in conjunction with the accompanying drawings.

FIGS. 4A-4B are respectively a vertical cross-sectional view of the exemplary SOI substrate illustrating etching annular trenches followed by having the photoresist removed.

FIGS. 8A-8B illustrate a schematic diagram depicting a vertical cross-sectional view of the structure, wherein

FIGS. 9A-9B shows a vertical cross-sectional view of the structure (FIG. 9A), wherein two contacts buried stacked are represented for illustrative purposes by dual damascene wires when forming the drain and the source of the U-FET, and for illustrative purposes, a single damascene wire forming the gate of the U-FET.

DETAILED DESCRIPTION

In the following description, numerous specific details are set forth to provide a thorough understanding of embodiments of the present disclosure. However, it can be recognized that embodiments of the disclosure can be practiced without the specific details. In some instances, well-known structures and processes are not described in detail to avoid unnecessarily obscuring embodiments of the present disclosure.

Aspects of the present disclosure will now be described in detail with accompanying figures. It is noted that like reference numerals refer to like elements across different embodiments. The drawings are not necessarily drawn to scale. Ordinals are used merely to distinguish among similar elements, and different ordinals can be employed across the specification and the claims of the instant application.

Because of the high aspect ratio (i.e., width to depth) of through-silicon-vias (TSVs) the integrity (e.g., local thickness and composition and local dielectric constant) of the dielectric liner of the TSV can be guaranteed through the entire TSV surface. The TSVs according to an embodiment provide an electrically conductive core between an inner region of the dielectric liner and an outer region of the dielectric liner.

Referring to FIG. 2A through FIG. 9B, an exemplary semiconductor structure is described according to embodiments of the present disclosure. It further describes a method for fabricating and testing the TSV.

Figure 2A:
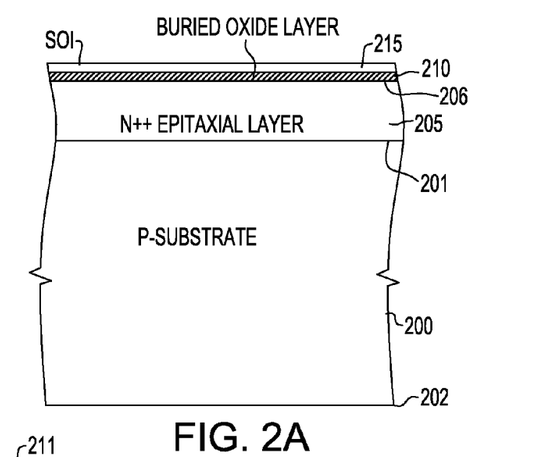
FIG. 2A shows a vertical cross-sectional view of an initial step of an SOI wafer, according to an embodiment.

FIG. 2A is a cross-section view of a region of an SOI (Silicon-on-insulator) wafer. In FIG. 2A, substrate 200 (e.g., a single-crystal silicon substrate with P– doping, also known as lightly P– doped) has a top surface 201 and a bottom surface 202. The substrate additionally possesses a non-isolated epitaxial layer 205 of opposite type (e.g., an N++ doped layer, also known as degenerately N-doped) on the top surface 201 of the substrate 200. On top surface 206, there is an insulating buried oxide layer 210 (e.g., dielectric in an SOI wafer). On the insulating buried oxide layer 210, there is an SOI conducting layer 215, which in some embodiments can be silicon.

Figure 2B:
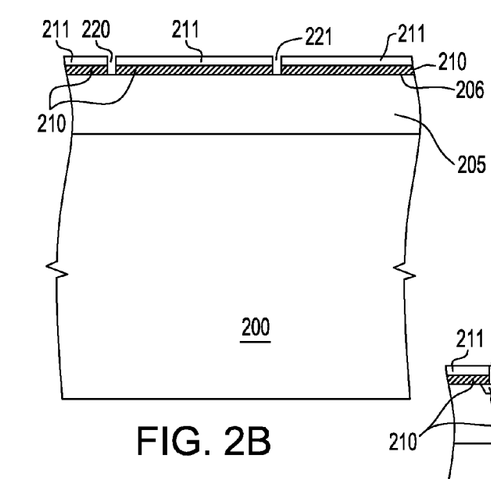
FIG. 2B illustrates a vertical cross-sectional view of the exemplary SOI substrate showing a dielectric layer superimposed on top of the buried oxide layer, and having windows exposing areas of a n++ epitaxial layer implant.

FIG. 2B shows the first step in the creation of a U-FET from an SOI wafer. The final goal is intended to create a FET using the bulk of the substrate 200 as a semiconducting medium. In order to form the source and the drain terminals of the U-FET, first the SOI conducting layer can be removed and replaced with a first interlevel dielectric layer 211. Then, two isolated vias 220 and 221 are created by first etching through the first interlevel dielectric layer 211 and the insulating buried oxide layer 210. The two exposed top surfaces of the non-isolated epitaxial layer 205 can be in some embodiments implanted, thereby forming ohmic contacts.

Figure 2C:
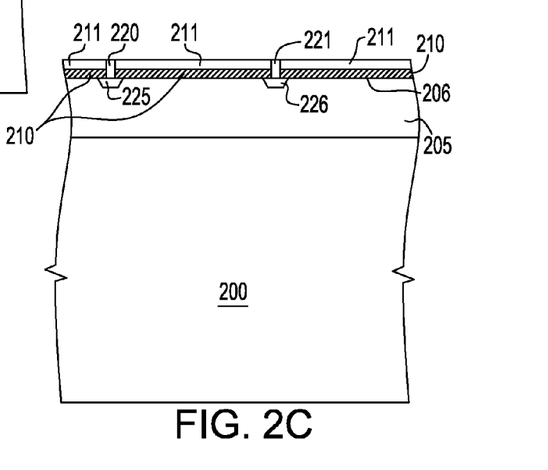
FIG. 2C is a vertical cross-sectional view of the exemplary SOI substrate of FIG. 2B showing vias filled with conductor material.

In FIG. 2C, the exposed top surfaces of the non-isolated epitaxial layer 205 are implanted to form ohmic contacts 225 and 226 (e.g., N+ doped layer resulting from slightly N-doping exposed top surface of non-isolated epitaxial layer 205 with aid of lithography). Vias 220 and 221 are filled with conductor to form ohmic contacts 225 and 226, respectively.

Figure 2D:
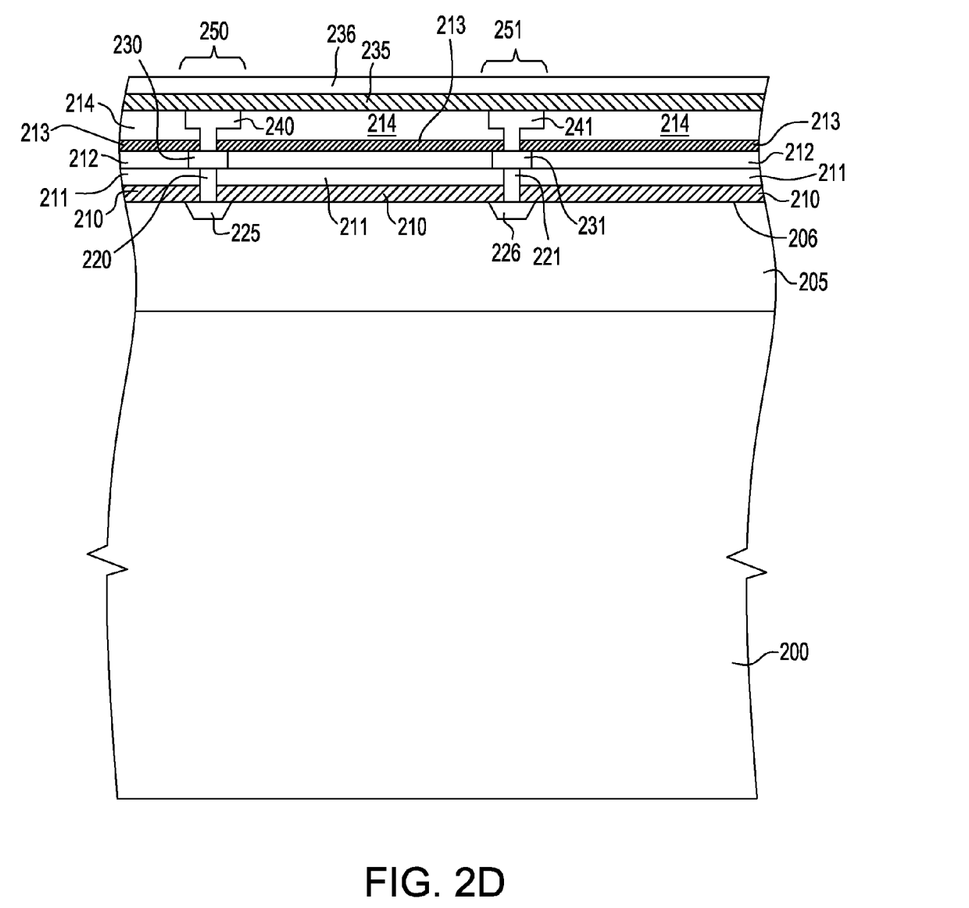
FIG. 2D illustrates a vertical cross-sectional view of two stacked conductors capped by dielectric on the top surface and contacted to the same n++ epitaxial layer by way of a n+ implant on the bottom surface.

In FIG. 2D, a second interlevel dielectric layer 212 is formed on a top surface of first interlevel dielectric layer 211. Damascene wires 230 and 231 contacting vias 220 and 221 are formed in the second interlevel dielectric layer 212. Formed on the top surface of second interlevel dielectric layer 212 are a third interlevel dielectric layer 213 and fourth interlevel dielectric layer 214. Furthermore, formed in third and fourth interlevel dielectric layers 213 and 214 are dual-damascene wires 240 and 241 contacting damascene wires 230 and 231, respectively. Formed on the top surface of the fourth interlevel dielectric layer 214 are a fifth interlevel dielectric layer 235 and a sixth interlevel dielectric layer 236. Thus, there is an electrical path from dual-damascene wire 240 to substrate 200 and an electrical path from dual-damascene wire 241 to substrate 200. Non-isolated epitaxial layer 205, ohmic contact 225, via 220, damascene wire 230 and dual damascene wire 240 include a first wire stack 250 providing electrical contact to substrate 200. Non-isolated epitaxial layer 205, ohmic contact 226, via 221, damascene wire 231 and dual damascene wire 241 include a second wire stack 251 which provides electrical contact to substrate 200. In one embodiment, dielectric interlevel layers 213 and 235 include a material that is a diffusion barrier to copper. In one embodiment, interlevel dielectric layers 213 and 235 include silicon nitride. In an embodiment, interlevel dielectric layers 211, 212, 214 and 236 are made of silicon oxide. In another embodiment, interlevel dielectric layer 236 employs tetra-ethylorthosilicate (TEOS). In another embodiment, vias 220 and 221 use tungsten and wires 230, 231, 240 and 241 are made of copper. The number of dual-damascene wires stacked vertically ranges from one to twenty. Preferably, there can be two interlevel dielectric levels for each dual-damascene wire level, totaling two to forty. Furthermore, two interlevel dielectric levels on the topmost surface can be dual-damascene wire forming a wire stack.

A damascene wire or contact is a wire or contact by way of processes in which wire trenches or via openings are formed in an interlevel dielectric layer. An electrical conductor of sufficient thickness to fill the trenches is deposited in the trenches and on a top surface of the interlevel dielectric layer. A chemical-mechanical-polish (CMP) process is preferably performed to remove excess conductor and make the surface of the conductor co-planar with the surface of the interlevel dielectric layer to form damascene wires (or damascene vias). A dual-damascene wire or contact is a wire or contact formed in either a via first dual-damascene process or a trench first dual-damascene process. In the via first dual-damascene process, via openings are formed through the entire thickness of an interlevel dielectric layer, and is followed by forming the trenches part of the way through the interlevel dielectric layer illustrated in any given cross-sectional view. In a trench first dual-damascene process is one in which trenches are likewise formed part of the way through the thickness of an interlevel dielectric layer, and is followed by forming vias within the trenches for the remaining interlevel dielectric layers. All the vias openings are intersected by integral wire trenches above and by a wire trench below, but not all the trenches need intersecting a via opening. An electrical conductor of sufficient thickness to fill the trenches and via opening is deposited on a top surface of the dielectric, followed by a CMP process performed to make the surface of the conductor in the trench coplanar with the surface the interlevel dielectric layer, forming dual-damascene wires to create corresponding integral dual-damascene vias. Wiring levels are included of the interlevel dielectric layer and the corresponding damascene and/or dual damascene wires formed in the interlevel dielectric layer.

Figure 3:
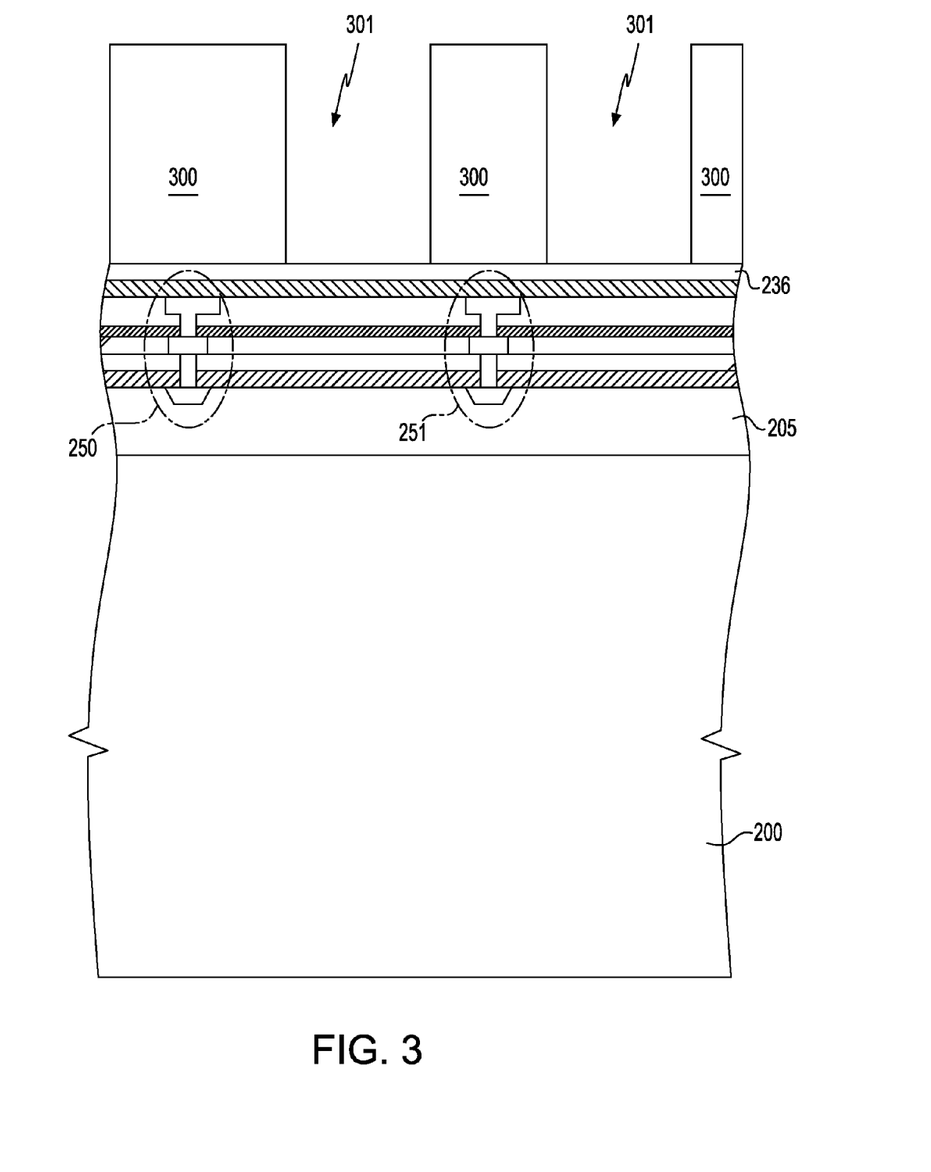
FIG. 3 depicts a vertical cross-sectional view of the exemplary SOI substrate of FIG. 2D illustrating a patterned photoresist.

In FIG. 3, a patterned photoresist layer 300 is formed on the top surface of dielectric layer 236 over first wire stack 250 and second wire stack 251, with an annular trench 301 surrounding the photoresist covering second wire stack 251.

Figure 4A:
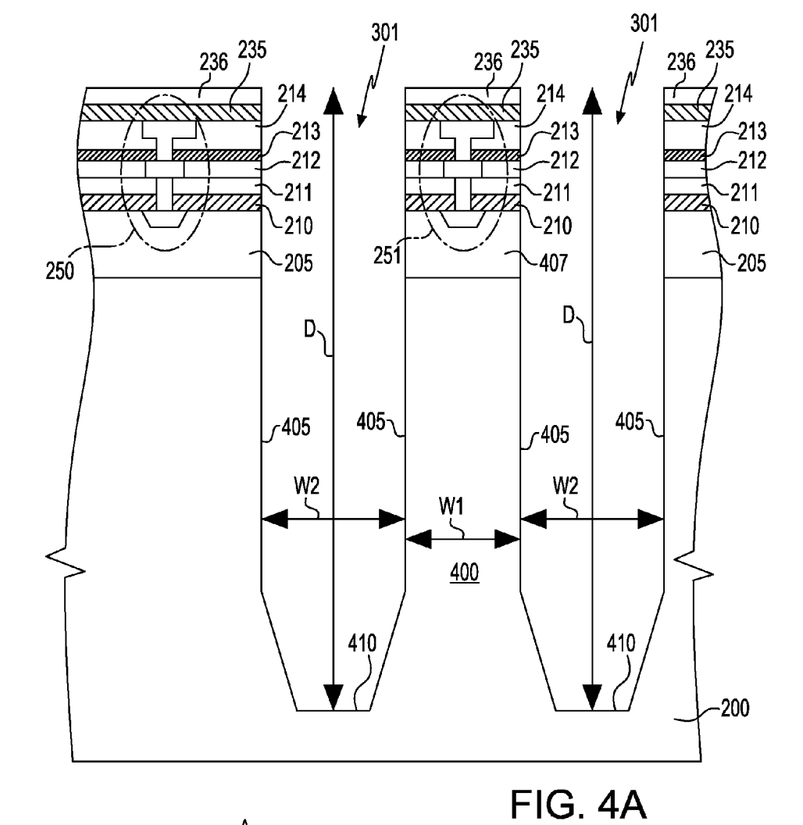
Figure 4B:
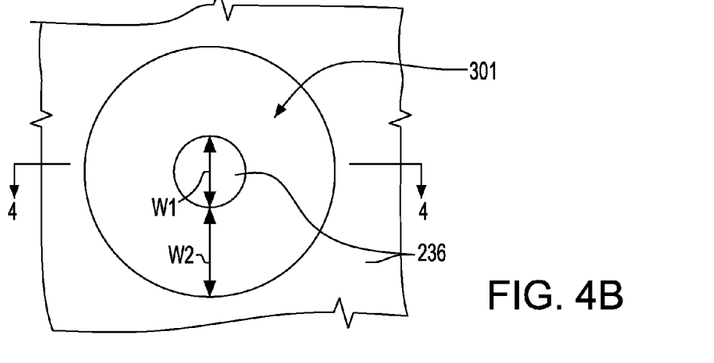
FIG. 4B illustrates a top view of the etched annular trench.

Referring now to FIGS. 4A and 4B, the annular trench 301 (IG. 4B) with sidewalls 405 and bottom 410 is etched (in one embodiment, by one or more reactive ion etch (RIE) processes) through dielectric layers 236, 235, 214, 213, 212, 211 and 210, into non-isolated epitaxial layer 205, and into substrate 200 at a depth D. The etching process isolates non-isolated epitaxial layer 205 from isolated epitaxial layer 407.

FIG. 4A is a sectional view through line 4-4 of FIG. 4B. Annular trench 301 surrounds core 400 of substrate 200. Core 200 has a width W1 and annular trench 301 has a width W2. In one embodiment, D may range from about 1 micron to about 100 microns. In one embodiment, W1 ranges between about 0.1 micron and about 10 microns. In another embodiment, W2 ranges between about 1 micron and about 20 microns. Photoresist layer 300 (FIG. 3) is removed following the etching of annular trench 301. There are no devices (e.g., FETs, diodes, capacitors) formed in core 400.

Figure 5:
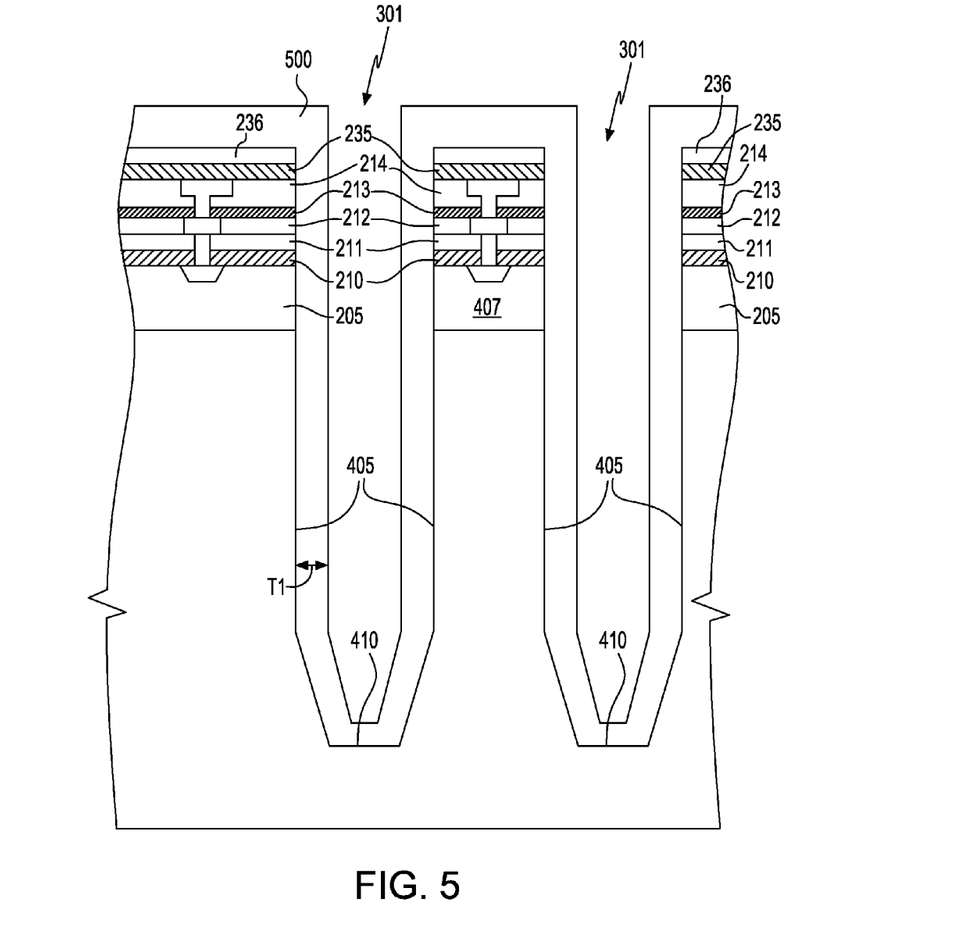
FIG. 5 is a schematic diagram of a vertical cross-sectional view of the structure illustrating coating the trench with a dielectric liner.

In FIG. 5, a dielectric liner 500 is formed on sidewalls 405 and bottom 410 of annular trench 301 as well as on the top surface of dielectric layer 236. Dielectric liner 500 has a thickness T1 on sidewalls 405 of annular trench 301. In one embodiment, T1 ranges between about 0.1 microns and about 3 microns. The dielectric layer can be formed by plasma enhanced chemical vapor deposition (PECVD) silicon oxide.

Figure 6:
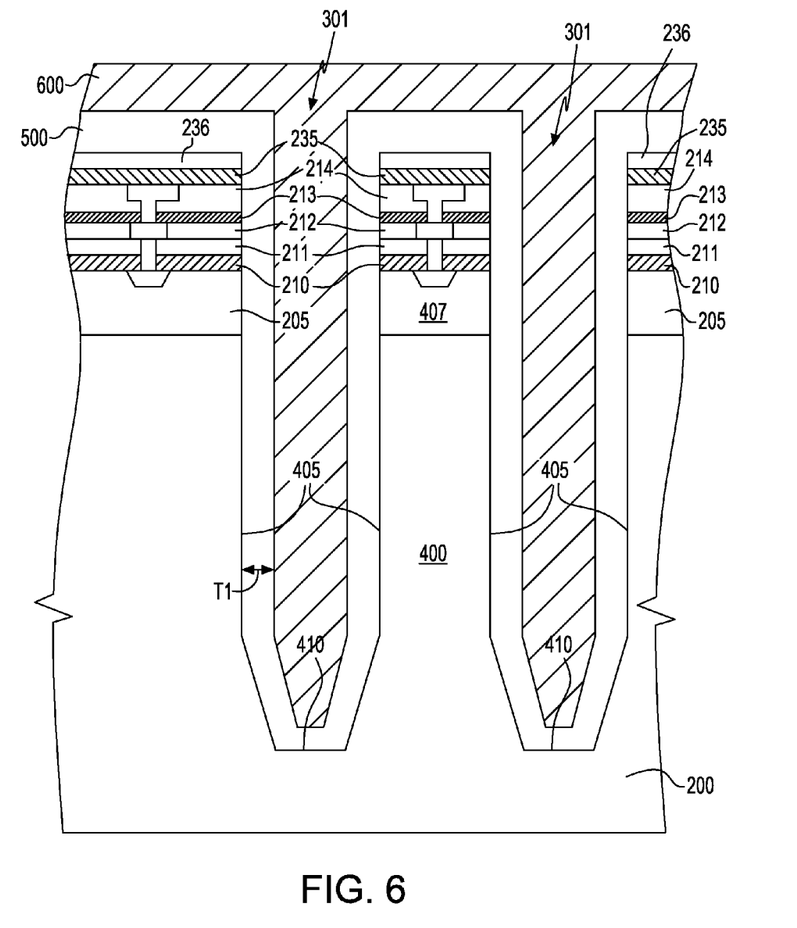
FIG. 6 shows the structure illustrating the trenches filled with electrical conductor fill.

In FIG. 6, an electrical conductor 600 is formed in annular trench 301 and on the top surface of dielectric liner 236. Conductor 600 totally fills the remaining space in trench 301.

In one embodiment, conductor 600 can be in the form of a tantalum nitride (TaN) layer deposited on the exposed surface of the dielectric liner 236; a tantalum (Ta) layer deposited on the exposed surface of TaN layer; copper-manganese (Cu—Mn) layer deposited on the exposed surface of Ta layer; and an electroplated copper core.

Figure 7:
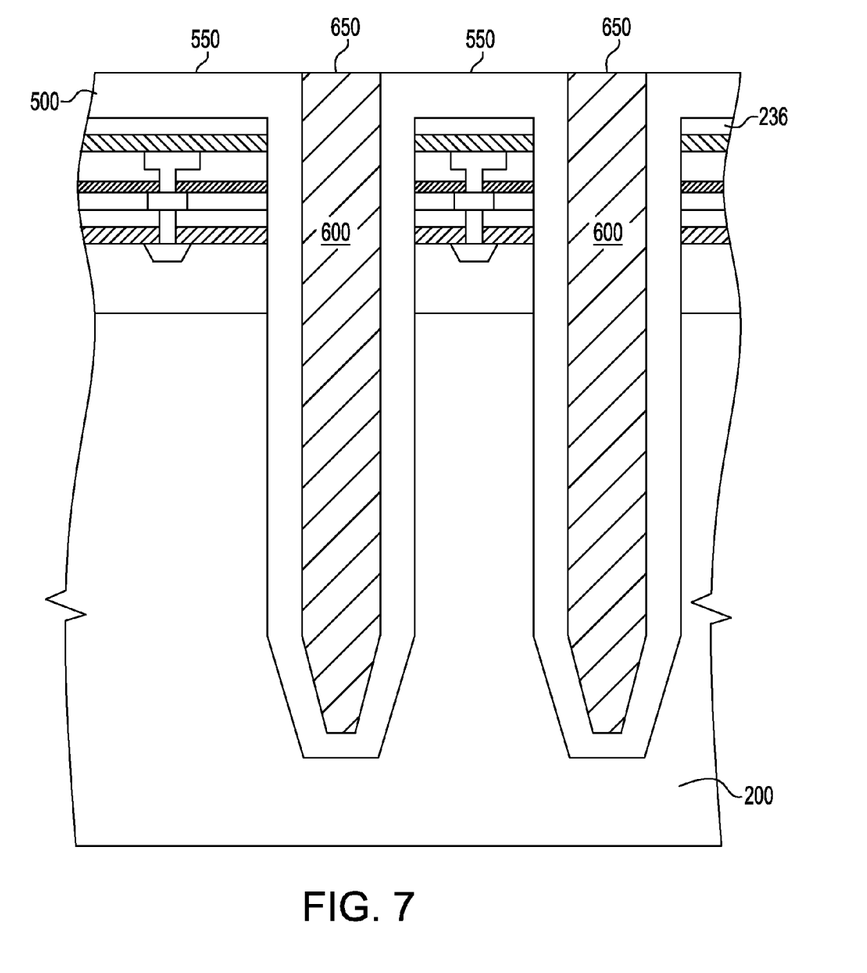
FIG. 7 depicts the structure with the top surface polished, preferably by way of chemical mechanical polish (CMP).

In FIG. 7, a chemical-mechanical polish (CMP) process is preferably performed to remove conductor from the top surface of dielectric liner 500. Thus, top surface 550 of dielectric liner 500 is coplanar with top surface 650 of conductor 600.

Figure 8A:
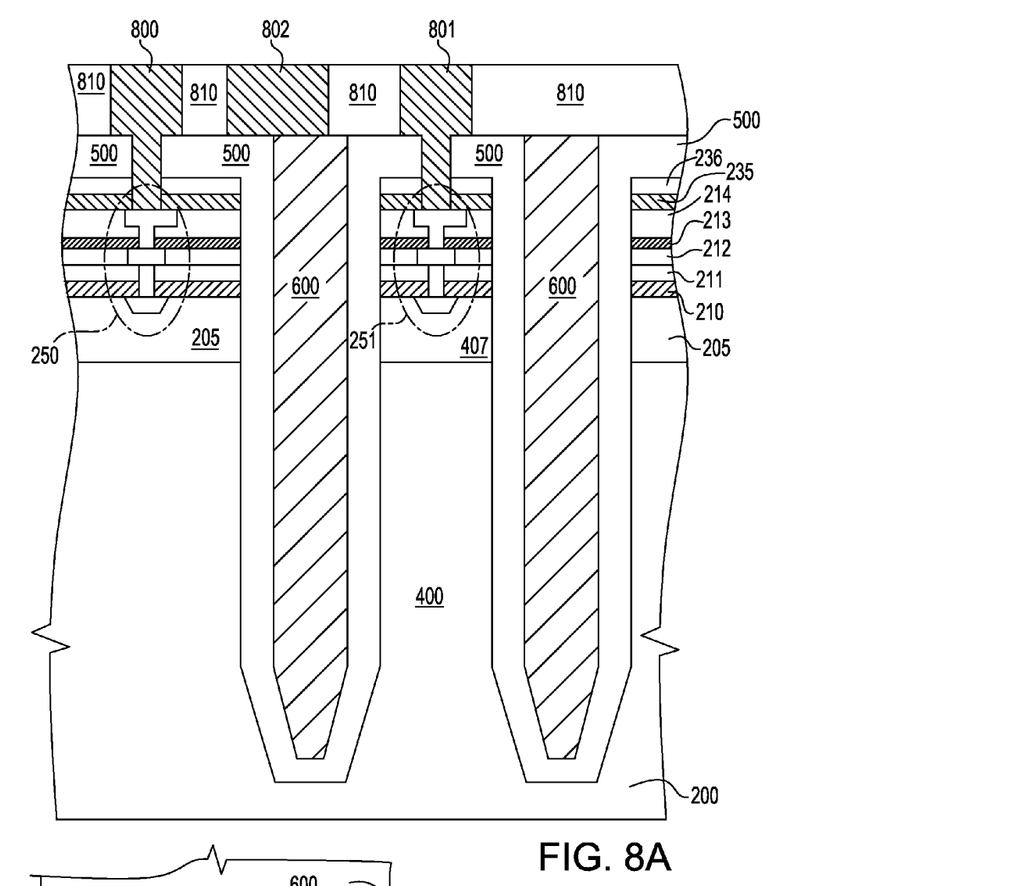
FIG. 8A illustrates the formation of new wires, and more particularly, two contacts buried stacked conductors (i.e., dual damascene wires) and one contact fill inside of the trench (i.e., a single damascene wire).

Referring to FIG. 8A, a first damascene stack contact 800 is formed through dielectric 810 and dielectric liner 500, and dielectric layers 236 and 235, thereby forming the first wire stack 250. A second damascene stack contact 801 is preferably formed through dielectric 810 and dielectric liner 500, and dielectric layers 236 and 235 forming a second wire stack 251. The first damascene stack contact 800 and second damascene stack contact 801 are isolated from electrical conductor 600 by dielectric layers 500, 236, 235, 214, 213, 212, 211 and 210, as well as by dielectric 810. A third damascene contact 802 is formed through dielectric layer 810 to conductor 600.

Figure 8B:
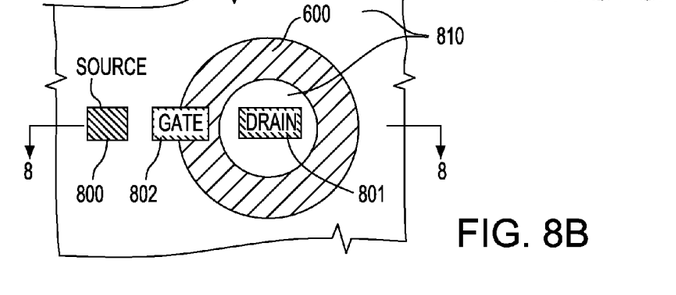
FIG. 8B depicts a top view of the same.

FIG. 8A is a sectional view through the line 8-8 of FIG. 8B. In FIG. 8B, conductor 600 is viewed through the dielectric layer 810.

Figure 9A:
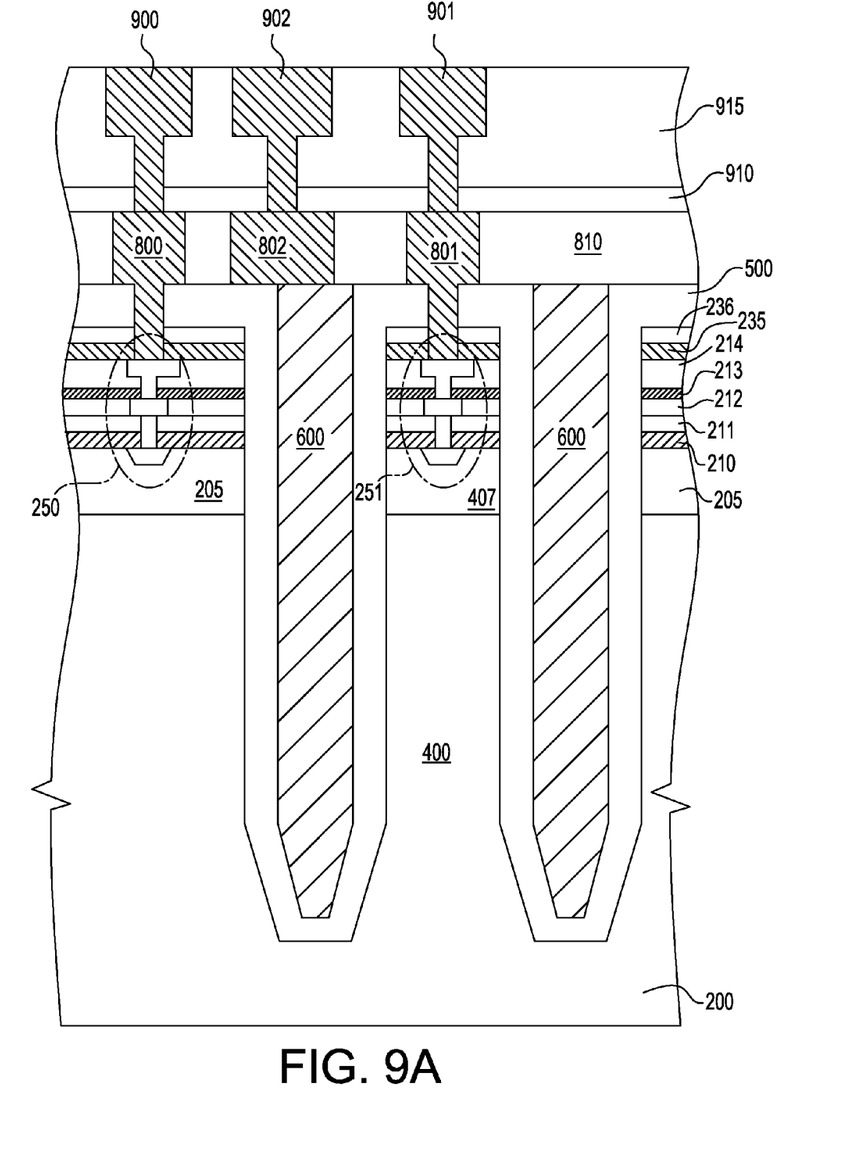
Figure 9B:
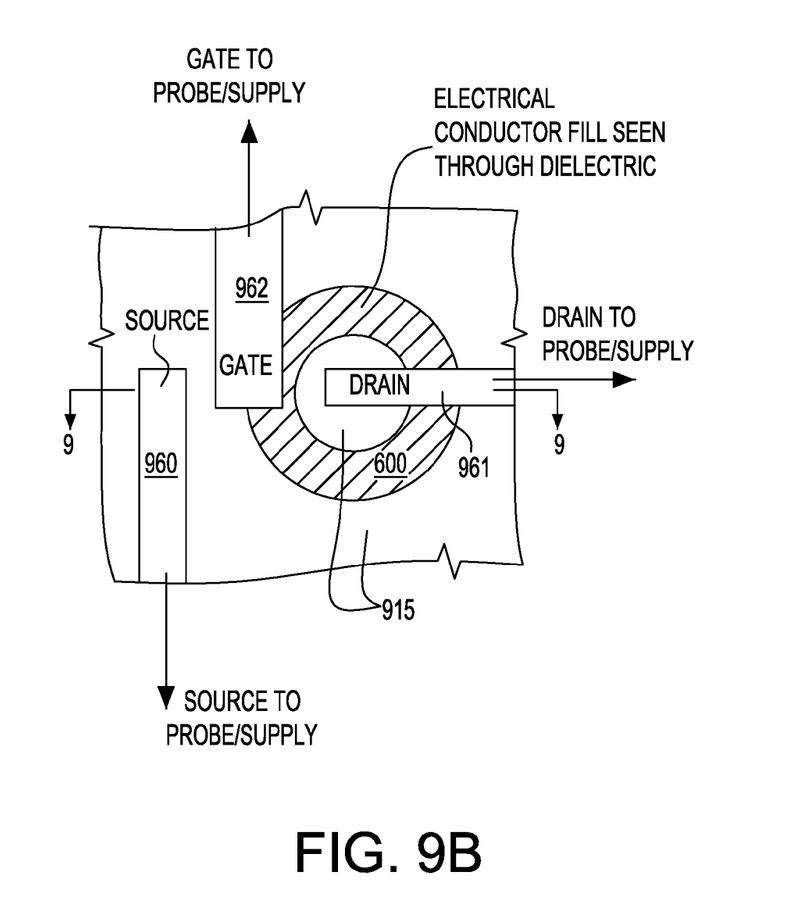
FIG. 9B illustrates a top view of the structure showing the drain, the source and the gate respectively connected to a power supply.

Referring to FIG. 9A, a source contact 900 is formed through dielectric layers 910 and 915 to a first damascene stack contact 800; a drain contact 901 is formed through dielectric layers 910 and 915 to second damascene stack contact 801; and a gate contact 902 is formed through dielectric layers 910 and 915 to a third damascene contact 802. FIG. 9A is illustrated as a sectional view through line 9-9 of FIG. 9B. In FIG. 9B, the source wire 960 connects to source contact 900, gate wire 962 connects to gate contact 902, and drain wire 961 connects to drain contact 901. Drain wire 961 is isolated from electrical conductor 600 by dielectric layers 915, 910 and 810, as well as dielectric liner 500.

Referring to FIG. 9B, drain wire 961 crosses over electrical conductor 600 while remaining isolated, and therefore functions as a jumper wire. Conductor 600 in FIG. 9B is seen through dielectric layers 915, 910 and 810. The source terminal of the U-FET includes first wire stack 250, first damascene stack contact 800, source contact 900, and source wire 960. The drain terminal of the U-FET includes second wire stack 251, second damascene stack contact 801, drain contact 901, and drain wire 961. The gate terminal of the U-FET includes electrical conductor 600, third damascene contact 802, gate contact 902 and gate wire 962.

Figure 9C:
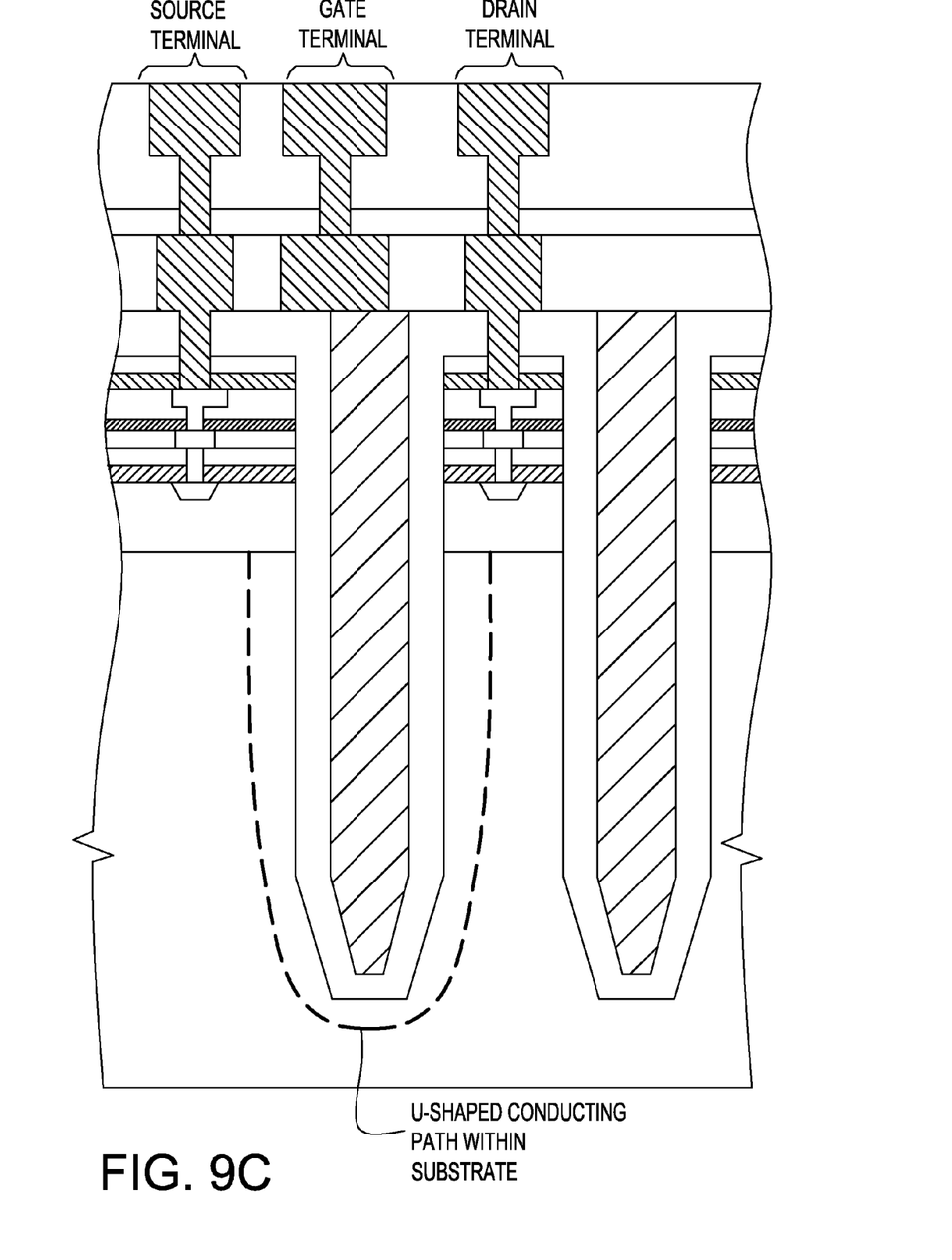
FIG. 9C shows a U-FET cross-sectional view of a U-shaped conducting path within a U-shape region of the substrate, according to an embodiment of the invention.

Referring to FIG. 9C, the final structure is illustrated showing the source terminal, gate terminal and drain terminal, and further highlighting the shape conductor path within the substrate.

Figure 10:
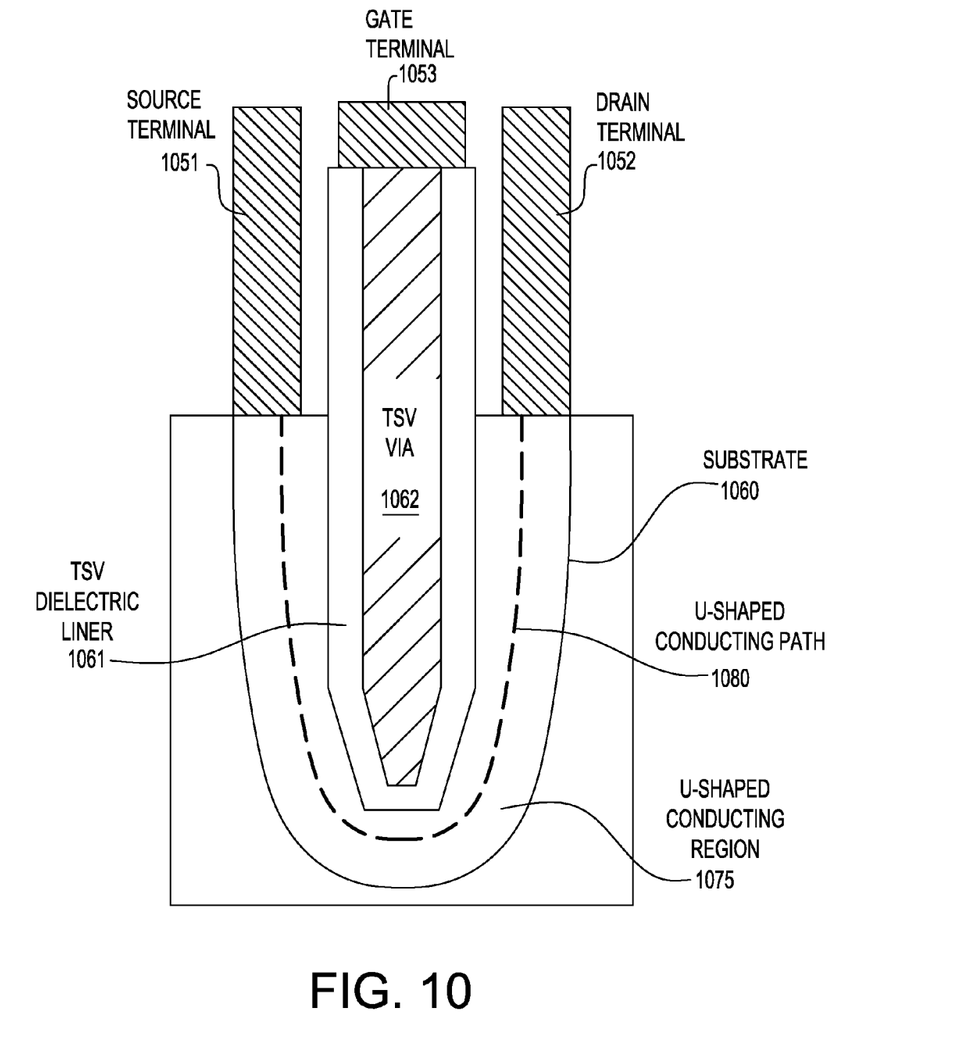
FIG. 10 illustrates a cross-sectional view of the final through-the-substrate via (TSV) integral to the U-FET, according to an embodiment of the invention.

FIG. 10 illustrates the final structure of the TVS U-FET showing the source, gate and drain terminals, where the gate terminal 1053 on top of TSV conductor 1062 extends to dielectric liner 1061. The U-shaped conducting region 1075 is fully embedded in substrate 1060, where a U-shaped conducting path 1080 within the substrate, spans from the source terminal 1051 and ending at the drain terminal 1052.

FIG. 10 illustrates the operation of the TSV U-FET operates as follows: electrical current flows through the n-channel in the p-silicon from the drain and the source terminals. Electrical current flows through the n– doping type channel in the p– doping type silicon from the drain and the source terminals. The TSV U-FET enables characterizing the gate oxide thickness surrounding the TSV, the TSV top profile, and the impact of ion contamination in the p– silicon region, which can be caused by Cu ions originating from the TSV.

TSVs according the embodiments of the present invention can be used, after high-voltage stress testing, in functional circuits of integrated circuit chips. Alternatively, TSVs according the embodiments of the present invention can be used as dummy, stress test only structures of integrated circuit chips.

While TSVs according to embodiments of the present invention have been illustrated in FIGS. 4B, 8B and 9B as having a circular perimeter when viewed from the top surface of the substrate, TSVs according to embodiments of the present invention can be shaped oval, square, rectangular, polygon or irregular perimeters when viewed from the top surface of the substrate.

Thus, the embodiments of the present invention provide a novel FET geometry consisting of source and drain contacts outside and inside the annular trench, respectively, and a TSV conductor functioning as the FET gate. The source and drain contacts are contacted to the P– substrate through wire stacks to ohmic contacts to the isolated N++ epitaxial layers outside the TSV and within the TSV. Furthermore, a channel is created linking the drain and the source through a U-shaped conducting path 1080 extracted from the U-shaped conducting region 1075.

A conducting channel in the P– substrate exists between source and drain following the shape of the TSV dielectric liner and resembles a letter U. The electrical properties of this U-shaped FET depend on the profile of the TSV and the integrity of the dielectric liner, and therefore can be used to detect and diagnose fabrication problems with the TSV that can hinder chip functionality.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A semiconductor structure comprising:
    a) a built-in U-shaped FET transistor having a TSV providing an annular gate, said TSV partially buried in a substrate, said annular gate being bound by an oxide layer, said annular gate having an inner and outer surface;
    b) a drain formed on an isolated epitaxial layer on a top surface of said substrate conformally connected to said gate oxide layer surrounding said inner surface of said TSV; and
    c) a source partially contacting said gate oxide layer conformally connected to said gate oxide layer surrounding said outer surface of said TSV.

2. The semiconductor structure of claim 1 wherein said built-in U-shaped FET transistor drain is essentially concentric with said annular gate and bound by said inner surface.

3. The semiconductor structure of claim 1 further comprising a drain terminal extending from said drain, said drain terminal formed by a metal stack resting on an ohmic contact.

4. The semiconductor structure of claim 3 wherein said metal stack comprises a wire jumping over said annular gate.

5. The semiconductor structure of claim 1 wherein said isolated epitaxial layer is bound by a TSV dielectric liner.

6. The semiconductor structure of claim 1, wherein said isolated epitaxial layer is an n++ type doped layer and said substrate comprises a p– type doped layer, or said isolated epitaxial layer is a p++ type doped layer, and said substrate comprises an n– type doped layer.

7. The semiconductor structure of claim 1 further comprising a gate terminal formed by a metal stack resting on said annular gate.

8. The semiconductor structure of claim 1 further comprising a source terminal superimposed over said source, said source terminal formed by a metal stack resting on an ohmic contact.

9. The semiconductor structure of claim 1, wherein said TSV inner and outer annuli are separated from each other by dielectric fill.

10. The semiconductor structure of claim 1 further comprising a channel linking said drain to said source, through a U-shaped conducting path.

11. The semiconductor structure of claim 10 wherein said U-shaped conducting path is extracted from a U-shaped conducting region of said substrate.

12. The semiconductor structure of claim 1 wherein said source is formed on a non-isolated epitaxial layer on a top surface of said substrate connected to said gate oxide layer surrounding said outer surface of said TSV.

13. A method of forming a semiconductor structure comprising:
   forming a built-in U-shaped FET transistor having a TSV providing an annular gate, said TSV partially buried in a substrate, said annular gate being bound by an oxide layer, said annular gate having an inner and outer surface;
   forming a drain from an isolated epitaxial layer on a top surface of said substrate conformally connected to said gate oxide layer surrounding said inner surface of said TSV; and
   forming a source partially contacting said gate oxide layer conformally connected to said gate oxide layer surrounding said outer surface of said TSV.

14. The method of claim 13, wherein said U-shape FET transistor further comprises etching annular trenches followed by selectively removing photoresist.

15. The method of claim 14 further comprises isolating said annular trenches with a dielectric liner.

16. The method of claim 14 further comprises filling said annular trenches with an electrical conductor.

17. The method of claim 13, wherein a first terminal is formed by a metal stack running through a core of said TSV, contacting said isolated epitaxial layer following creating said TSV annulus.

18. The method of claim 17, further comprising:
   providing three terminals, wherein a first terminal is formed by a metal stack extending through the core of said TSV contacting said isolated epitaxial layer;
   forming said TSV annulus;
   forming a second terminal with metal wire connected to said TSV; and
   forming said built-in U-shaped FET providing said third terminal made of metal wire surrounding an n++ epitaxial layer.

19. The method of claim 13 further comprising:
   forming a source contact through dielectric layers to a first damascene contact;
   forming a drain contact through said dielectric layers to a second damascene contact; and
   forming a gate contact through said dielectric layers to a third damascene contact.

20. The method of claim 17 wherein said built-in U-shaped FET transistor drain is essentially concentric with said annular gate and bound by said inner surface.

* * * * *